United States Patent
Hu

(10) Patent No.: US 11,217,129 B2
(45) Date of Patent: Jan. 4, 2022

(54) DISPLAY PANEL FACILITATING DETECTION OF A SHIFT REGISTER WITHOUT NEEDING TO PRY UP THE DISPLAY PANEL AND DISPLAY DEVICE

(71) Applicants: HKC CORPORATION LIMITED, Guangdong (CN); CHONGQING HKC OPTOELECTRONICS TECHNOLOGY CO., LTD., Chongqing (CN)

(72) Inventor: Yunqin Hu, Chongqing (CN)

(73) Assignees: HKC CORPORATION LIMITED, Shenzhen (CN); CHONGQING HKC OPTOELECTRONICS TECHNOLOGY CO., LTD., Chongqing (CN)

( * ) Notice: Subject to any disclaimer, the term of this patent is extended or adjusted under 35 U.S.C. 154(b) by 0 days.

(21) Appl. No.: 16/314,883

(22) PCT Filed: Nov. 30, 2018

(86) PCT No.: PCT/CN2018/118442
§ 371 (c)(1),
(2) Date: Jan. 3, 2019

(87) PCT Pub. No.: WO2019/242243
PCT Pub. Date: Dec. 26, 2019

(65) Prior Publication Data
US 2021/0110744 A1     Apr. 15, 2021

(30) Foreign Application Priority Data
Jun. 22, 2018  (CN) .......................... 201810651700.5

(51) Int. Cl.
*G09G 3/00* (2006.01)
*G11C 19/28* (2006.01)

(52) U.S. Cl.
CPC .............. *G09G 3/006* (2013.01); *G11C 19/28* (2013.01); *G09G 2310/0286* (2013.01)

(58) Field of Classification Search
CPC .......... G09G 3/006; G09G 2300/0426; G09G 2310/0286; H01L 22/30; G11C 19/28
See application file for complete search history.

(56) References Cited

U.S. PATENT DOCUMENTS

2016/0313392 A1\* 10/2016 Dong ................. G01R 31/2884
2017/0141181 A1\* 5/2017 Ni ......................... H01L 27/326
2019/0280074 A1\* 9/2019 Li .......................... H01L 27/124

FOREIGN PATENT DOCUMENTS

| CN | 101038315 A | 9/2007 |
| CN | 101488310 A | 7/2009 |

(Continued)

OTHER PUBLICATIONS

Qingna Li, the ISA written comments, Mar. 2019, CN.

*Primary Examiner* — Xuemei Zheng

(57) ABSTRACT

A display panel, and the display panel includes an array substrate, a counter substrate, a plurality of active switches, a shift register, a plurality of first testing pads, a plurality of second testing pads, and a tester; an input of the tester is connected to the plurality of first testing pads, an output of the tester is connected to the plurality of second testing pads. Thereby the shift register can be directly detected without pry up the panel, the circuit on the array substrate can be prevented from damaging, which can contribute to the analysis and improvement of the circuit issue.

17 Claims, 5 Drawing Sheets

(56) References Cited

FOREIGN PATENT DOCUMENTS

| | | |
|---|---|---|
| CN | 105277814 A | 1/2016 |
| CN | 106019672 A | 10/2016 |
| CN | 108831359 A | 11/2018 |
| JP | S6352121 A | 3/1988 |

* cited by examiner

DISPLAY PANEL FACILITATING DETECTION OF A SHIFT REGISTER WITHOUT NEEDING TO PRY UP THE DISPLAY PANEL AND DISPLAY DEVICE

CROSS-REFERENCE TO RELATED APPLICATION

This application is the International Application No. PCT/CN2018/118442 for entry into US national phase, with an international filing date of Nov. 30, 2018 designating the U.S., now pending, and claims priority benefits to Chinese Patent Application No. 201810651700.5, filed on Jun. 22, 2018, the contents of which being incorporated herein by reference.

TECHNICAL FIELD

The present application relates to the technical field of detection circuits in the field of panel detection, and more particularly to a display panel and a display device.

BACKGROUND

In recent years, with the advancement of science and technology, planar liquid crystal display has become popular, which has the advantage of being light and thin. The drive circuit of the planar liquid crystal display is mainly composed of a panel and an integrated circuit (integrated circuit) connected outside of the panel, but this method cannot reduce the cost of the product and cannot make the panel thinner.

A liquid crystal display device usually has a gate drive circuit, a source drive circuit, and a pixel array. The pixel array has a plurality of pixel circuits, each pixel circuit is turned on and off according to a scanning signal provided by the gate drive circuit, and displays a data image according to a data signal provided by the source drive circuit. In the case of the gate drive circuit, the gate drive circuit usually provides with a multi-stage shift register, and outputs the scanning signal to the pixel array by means of a first-stage shift register being transmitted to a next-stage shift register; so that the pixel circuits are sequentially turned on to enable the pixel circuit to receive the data signal.

Therefore, in the processing of the drive circuit, the gate drive circuit is directly manufactured on the array substrate to replace the drive chip manufactured by the external connection IC. Application of called gate on array (GOA) technology can be made directly around the panel to reduce production processes and product costs and making the panel thinner.

In the production process of display device, the display panel often has problems related to the gate array drive circuit. In the process of resolving the problem, it is necessary to test the nodes of the gate array drive circuit and the output signal of gate array drive circuit to confirm the cause of the failure. When the output signal of the gate array drive circuit is tested, the counter substrate (such as a color film substrate or a glass substrate that is oppositely disposed) of the array substrate must be pried up and then to be tested. This method has a relatively low success rate and often damages the relevant circuit on the side of the array substrate, which causing the problem of no further testing.

TECHNICAL SOLUTIONS

An object of the present application is to provide a display panel, including but not limited to solve the technical problem of detecting the shift register without pry up the panel.

The present application adopts the technical solution is that a display panel includes:
an array substrate;
a counter substrate, disposed opposite to the array substrate;
a plurality of active switches, disposed on the array substrate;
a shift register, disposed on the array substrate and located at a side of the array substrate;
a plurality of first testing pads, disposed on the array substrate, and the plurality of first testing pads are electrically coupled to the shift register;
a plurality of second testing pads, disposed on the array substrate; and
a tester, disposed on the array substrate, the tester comprises an input and an output, the input of the tester is connected to the plurality of first testing pads to achieve electrically coupling with the shift register, the output of the tester is connected to the plurality of second testing pads.

Another object of the present application is to provide a display panel, including:
an array substrate;
a counter substrate, disposed opposite to the array substrate;
a plurality of active switches, disposed on the array substrate;
a shift register, disposed on the array substrate and located at a side of the array substrate;
a plurality of first testing pads, disposed on the array substrate, and the plurality of first testing pads are electrically coupled to the shift register;
a plurality of second testing pads, disposed on the array substrate; and
a tester, disposed on the array substrate, the tester comprises an input and an output, the input of the tester is one-to-one correspondingly connected to the plurality of first testing pads to achieve electrically coupling with the shift register, the output of the tester is one-to-one correspondingly connected to the plurality of second testing pads;
a wiring between the tester and the plurality of first testing pads is coated onto or bonded to the array substrate, and a wiring between the tester and the plurality of second testing pads is coated onto or bonded to the array substrate.

Further object of the present application is to provide a display device, including: a display panel and a controller configured to control the operation of the display panel, and the display panel includes:
an array substrate;
a counter substrate, disposed opposite to the array substrate;
a plurality of active switches, disposed on the array substrate;
a shift register, disposed on the array substrate and located at a side of the array substrate;
a plurality of first testing pads, disposed on the array substrate, and the plurality of first testing pads are electrically coupled to the shift register;
a plurality of second testing pads, disposed on the array substrate; and
a tester, disposed on the array substrate, the tester comprises an input and an output, the input of the tester is connected to the plurality of first testing pads to achieve electrically coupling with the shift register, the output of the tester is connected to the plurality of second testing pads; a wiring method between the tester and the plurality of first testing pads is a single layer metal wiring method, and a wiring method between the tester and the plurality of second testing pads is a double layer metal wiring method.

An embodiment of the present application is provided with a display panel, a tester connected with pad is disposed on an appearance surface of the display panel, thereby the shift register can be directly detected without pry up the panel, the circuit on the array substrate can be prevented from damaging, which can contribute to the analysis and improvement of the circuit issue.

BRIEF DESCRIPTION OF THE DRAWINGS

In order to explain the embodiments of the present application more clearly, a brief introduction regarding the accompanying drawings that need to be used for describing the embodiments of the present application or the prior art is given below; it is obvious that the accompanying drawings described as follows are only some embodiments of the present application, for those skilled in the art, other drawings can also be obtained according to the current drawings on the premise of paying no creative labor.

DETAILED DESCRIPTION OF THE EMBODIMENTS

Figure 1:
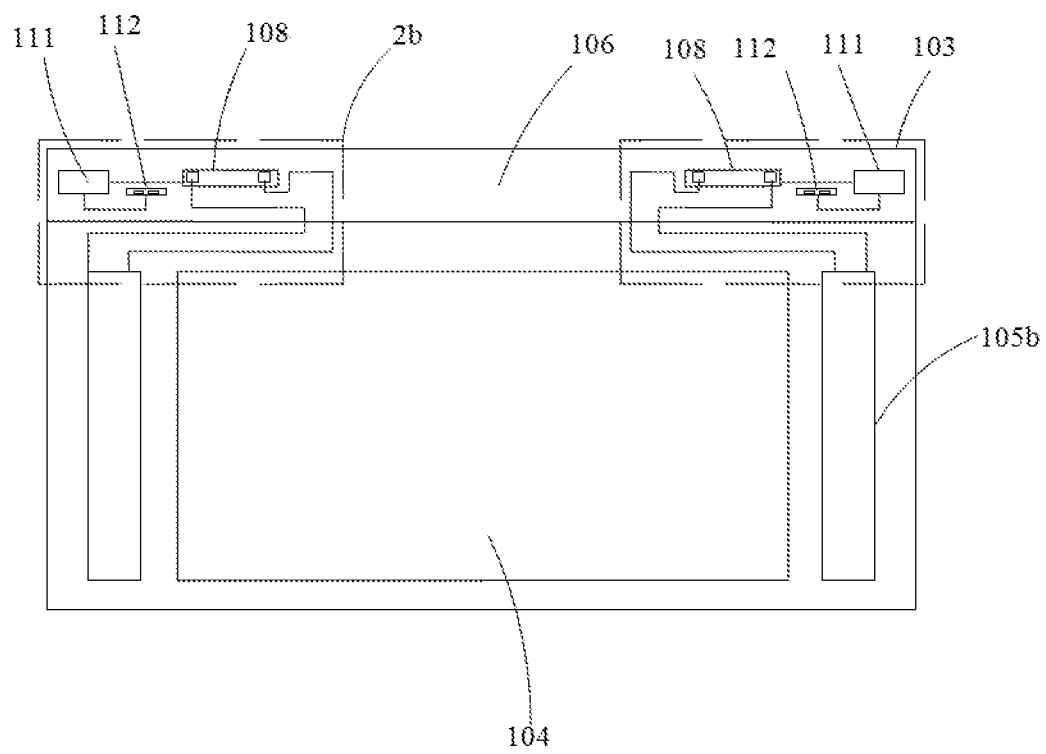
FIG. 1 is a schematic structural view of a display panel provided by an embodiment of the present application.

In order to make the purpose, the technical solution and the advantages of the present application be clearer and more understandable, the present application will be further described in detail below with reference to accompanying figures and embodiments. It should be understood that the specific embodiments described herein are merely intended to illustrate but not to limit the present application.

It is noted that when a component is referred to as being "fixed to" or "disposed at" another component, it can be directly or indirectly on another component. When a component is referred to as being "connected to" another component, it can be directly or indirectly connected to another component. Directions or location relationships indicated by terms such as "length", "width", "up", "down", "front", "rear", "left", "right", "vertical", "horizontal", "top", "bottom", "inside", "outside", and so on are the directions or location relationships shown in the accompanying figures, which are only intended to describe the present application conveniently and simplify the description, but not to indicate or imply that an indicated device or component must have specific locations or be constructed and manipulated according to specific locations; therefore, these terms shouldn't be considered as any limitation to the present application. Terms "the first" and "the second" are only used in describe purposes, and should not be considered as indicating or implying any relative importance, or impliedly indicating the number of indicated technical features. As such, technical feature(s) restricted by "the first" or "the second" can explicitly or impliedly comprise one or more such technical feature(s). In the description of the present application, "a plurality of" means two or more, unless there is additional explicit or specific limitation.

In order to explain the technical solutions described in the present application, the following detailed description will be made in combination with the specific drawings and embodiments.

The embodiment of the present application provides a display panel, as shown in FIGS. 1 to 6, including: an array substrate 103 and a counter substrate 104. The counter substrate 104 is disposed opposite to the array substrate 103, and a plurality of active switches and a plurality of shift registers 105b are disposed on the array substrate 103. The shift register 105b is disposed on one side of the array substrate 103. In addition, a plurality of first testing pads 108 and a plurality of second testing pads 112 are further disposed on the array substrate 103. The plurality of first testing pads 108 are electrically coupled to the shift register 105b. In addition, the display panel further includes a tester 111. The tester 111 is disposed on the array substrate 103. The tester 111 includes an input and an output, and the input of the tester 111 is electrically connected to the plurality of first testing pads 108, such that the electrically coupled to the shift register 105b is completed, and the output of the tester 111 is connected to the plurality of second testing pads 112. In this way, a tester connected with the second testing pad 112 is disposed on an appearance surface of the display panel, thereby the shift register 105b can be directly detected without pry up the panel, the circuit on the array substrate can be prevented from damaging, which can contribute to the analysis and improvement of the circuit issue. At the same time, it is also possible to effectively reuse the spare circuit configuration area and the testing pad on the array substrate 103.

In an embodiment, please refer to FIG. 1, the tester 111 is disposed within a range of a region in which the counter substrate 104 is vertically projected on the array substrate 103, so that the structure of the display panel is relatively compact. In addition, in the present embodiment, the tester 111 may be disposed outside the range of a region in which the counter substrate 104 is vertically projected on the array substrate 103, which is not limited herein.

Figure 2:
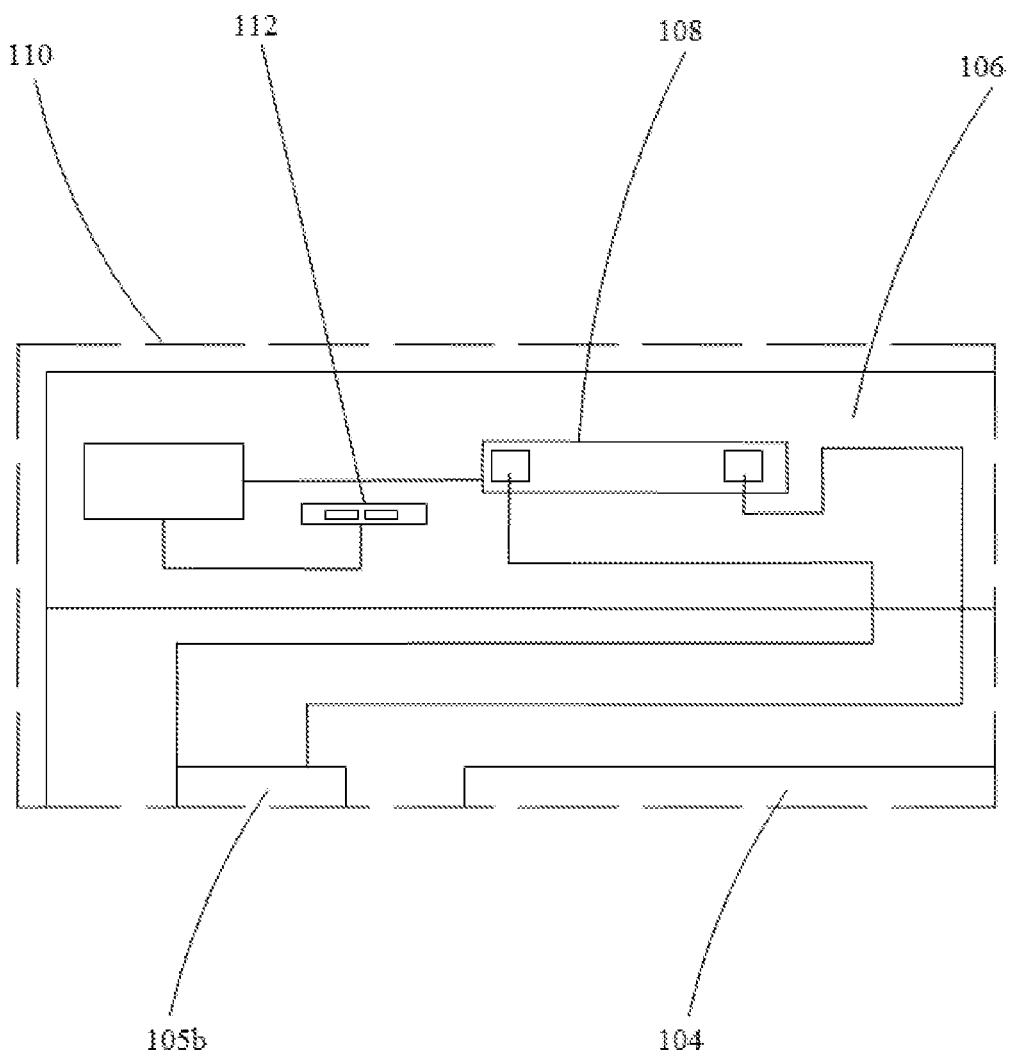
FIG. 2 is a partially enlarged schematic view of FIG. 1 according to an embodiment of the present application.

In an embodiment, please refer to FIG. 1 and FIG. 2, the plurality of first testing pads 108 and the plurality of the second testing pads 112 are respectively disposed on the side of the array substrate 103. By setting in this way, thereby the configuration area of space circuit on the array substrate 103 and the testing pad can be effectively utilized, thereby the production cost is reduced, and the overall structure is compact. In addition, in the embodiment, the plurality of first testing pads 108, the plurality of the second testing pads 112, and the tester 111 may be respectively disposed at other positions of the array substrate 103 according to actual conditions and specific requirements, which is not limited herein.

In an embodiment, please refer to FIG. 1 and FIG. 2, the tester 111 is also disposed on the side of the array substrate 103, and the input of the tester 111 is electrically coupled to the plurality of first testing pads 108, and the output of the tester 111 is electrically coupled to the plurality of second testing pads 112. By setting the tester 111 to the side of the array substrate 103, thereby the tester 111 is closed to the first testing pad 108 and the second testing pad 112 such that the circuit transmission travel is shortened, and the structure is compact, the cost is reduced. In addition, in the embodiment, the tester 111 may also be disposed at other positions of the array substrate 103 according to actual conditions and specific requirements, which is not limited herein.

In an embodiment, please refer to FIG. 1 and FIG. 2, the plurality of first testing pads 108, the plurality of second testing pads 112, and the tester 111 are disposed between the array substrate 103 and the counter substrate 104. In this way, the gap between the array substrate 103 and the counter substrate 104 is fully utilized, so that the arrangement is presented in a dense manner. In addition, in the embodiment, the plurality of first testing pads 108, the plurality of second testing pads 112, and the tester 111 can also be set at other locations, which is not limited herein.

Figure 5:
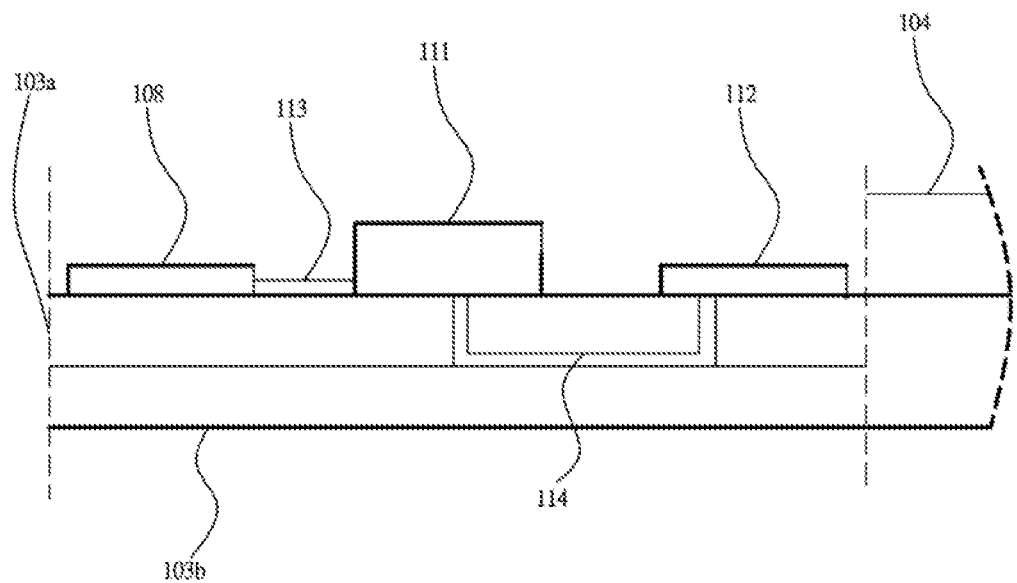
FIG. 5 is a schematic structural view of a wiring structure of a third display panel provided by an embodiment of the present application.
Figure 6:
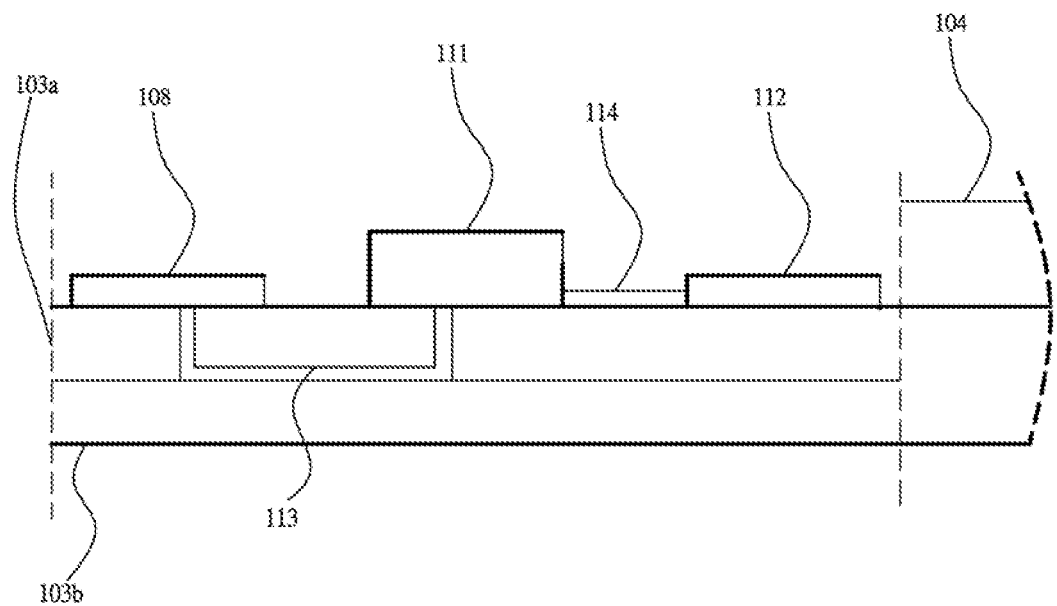
FIG. 6 is a schematic structural view of a fourth display panel provided by an embodiment of the present application.

In an embodiment, please refer to FIG. 5 and FIG. 6, the array substrate is a multilayer substrate, the multilayer substrate includes a first layer plate 103a and a second layer plate 103b; a wiring 113 between the tester 111 and the plurality of first testing pads 108 is disposed on a surface of the first layer plate 103a, a wiring 114 between the tester 111 and the plurality of second testing pads 112 is disposed on a surface of the second layer plate 103b, and the wiring 114 between the tester 111 and the plurality of second testing pads 112 is disposed between the first layer plate 103a and the second layer plate 103b. By setting such a wiring method, it is helpful to detect the shift register 105b, and the circuit problem is analyzed and improved. In the embodiment, the wiring 114 between the tester 111 and the plurality of second testing pads 112 is disposed on the surface of the second layer 103b, and the wiring 114 between the tester 111 and the plurality of second testing pads 112 is disposed between the first layer plate 103a and the second layer plate 103b. The wiring 113 between the tester 111 and the plurality of first testing pads 108 is disposed on the surface of the first layer plate 103a, thereby the circuit detection is achieved, which is not limited herein.

In an embodiment, the wiring 113 between the tester 111 and the plurality of first testing pads 108, and the wiring 114 between the tester 111 and the plurality of second testing pads 112 are disposed on the surface of the first layer plate 103a, or the wiring 113 between the tester 111 and the plurality of first testing pads 108, and the wiring 114 between the tester 111 and the plurality of second testing pads 112 are disposed on the surface of the second layer 103b, and the wiring 114 between the tester 111 and the plurality of second testing pads 112 is disposed between the first layer plate 103a and the second layer plate 103b. By wiring in this way, the wiring between the tester 111 and the plurality of first testing pads 108 and the plurality of second testing pads 112 can be realized on a single layer plate, thereby avoiding separate wiring on the two layer plates, the wiring process is simplified and the production efficiency is improved.

Figure 3:
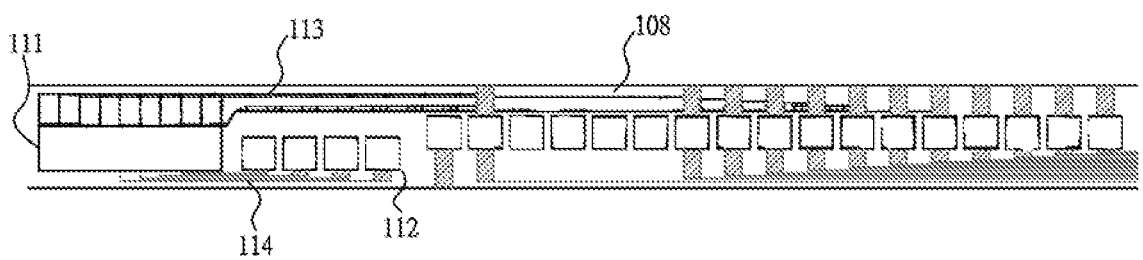
FIG. 3 is a schematic structural view of a wiring structure of a first display panel provided by an embodiment of the present application.
Figure 4:
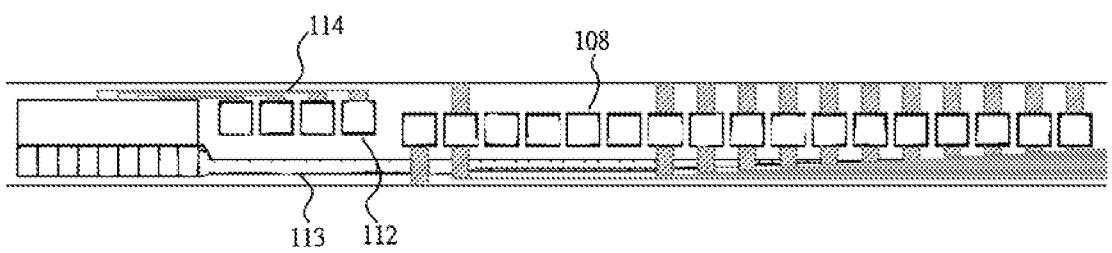
FIG. 4 is a schematic structural view of a wiring structure of a second display panel provided by an embodiment of the present application.

In an embodiment, please refer to FIG. 3 and FIG. 4, the wiring 113 between the tester 111 and the plurality of first testing pads 108 is adjacent to the edge of the array substrate 103, and the wiring 114 between the tester 111 and the plurality of second testing pads 112 is adjacent to the edge of the counter substrate 104; or, in the embodiment, the wiring 113 between the tester 111 and the plurality of first testing pads 108 is adjacent to the edge of the counter substrate 104, and the wiring 114 between the tester 111 and the plurality of second testing pads 112 is adjacent to the edge of the array substrate 103, or in the embodiment, the wiring 113 between the tester 111 and the plurality of first testing pads 108, and the wiring 114 between the tester 111 and the plurality of second testing pads 112 are adjacent to the edge of the array substrate 103, or the wiring 113 between the tester 111 and the plurality of first testing pads 108, and the wiring 114 between the tester 111 and the plurality of second testing pads 112 are adjacent to the edge of the counter substrate 104. In this way, by setting different wiring methods, the actual various requirements can be satisfied, which ensures that the circuit issue is analyzed and improved, and the space circuit configuration area and the testing pad on the array substrate 103 or the counter substrate 104 can be effectively utilized.

Optionally, the wiring method between the tester 111 and the plurality of first testing pads 108 is a single layer metal wiring method or a double layer metal wiring method, and the wiring method between the tester 111 and the plurality of second testing pads 112 is a single layer metal wiring method or a double layer metal wiring method. In addition, the wiring method between the tester 111, the plurality of first testing pads 10, and the plurality of second testing pads 112 may be other modes according to actual conditions and specific requirements, which is not limited herein.

Optionally, the input of the tester 111 is connected to total or partial of the plurality of first testing pads 108, so that the shift register 105b can be electrically coupled therewith.

Optionally, the output of the tester 111 is connected to total of the plurality of second testing pads 112. In addition, according to the actual situation and specific requirements, the output of the tester 111 is connected to partial of the plurality of second testing pads 112, which is not limited herein.

In the present application, further includes a display panel, and the display panel is substantially the same as the display panel, the difference is that the input of the tester 111 is connected to the plurality of first testing pads 108 in one-to-one correspondence, and the output of the tester 111 is connected to the plurality of second testing pads 112 in one-to-one correspondence, in addition, the wiring 113 between the tester 111 and the plurality of first testing pads 108 is coated onto the array substrate 103, and the wiring 114 between the tester 111 and the plurality of second testing pads 112 is coated onto the array substrate 103, so that the bonding strength between the wiring and the array substrate 103 can be enhanced. In addition, the tester 111 is compacted with the plurality of first testing pads 108 and the plurality of second testing pads 112 by the coating method, thereby the space occupied by the wiring is reduced. In addition, in the embodiment, the wiring 113 between the tester 111 and the plurality of first testing pads 108 may be disposed on the array substrate 103 by bonding or the like, and the wiring 114 between the tester 111 and the plurality of second testing pads 112 may also be disposed on the array substrate 103 by bonding or the like, which is not limited herein.

In an embodiment, the array substrate 103 is a multilayer substrate, the multilayer substrate includes a first layer plate 103a and a second layer plate 103b; a wiring 113 between the tester 111 and the plurality of first testing pads 108 is printed on a surface of the first layer plate 103a, and a wiring 114 between the tester 111 and the plurality of second testing pads 112 is printed on a surface of the second layer plate 103b, and the wiring 114 between the tester 111 and the plurality of second testing pads 112 is disposed between the first layer plate 103a and the second layer plate 103b. Thus, by means of printing, the wiring is integrated with the array substrate 103 described above, and the space occupied by the wiring on the array substrate 103 is reduced. In addition, in the embodiment, the wiring may be disposed on the array substrate 103 by other means such as coating or the like, which is not limited herein.

Optionally, the display panel of the present application can be, for example, is Twisted Nematic (TN), Super Twisted Nematic (STN), Optically Compensated Birefringence (OCB) display panel, or Organic Light Emitting Diode (OLED) display panel, and plasma display panel.

In an embodiment, the present application further includes a display device including a display panel and a controller. The display panel is a display panel as described above, which is not described herein.

Figure 7:
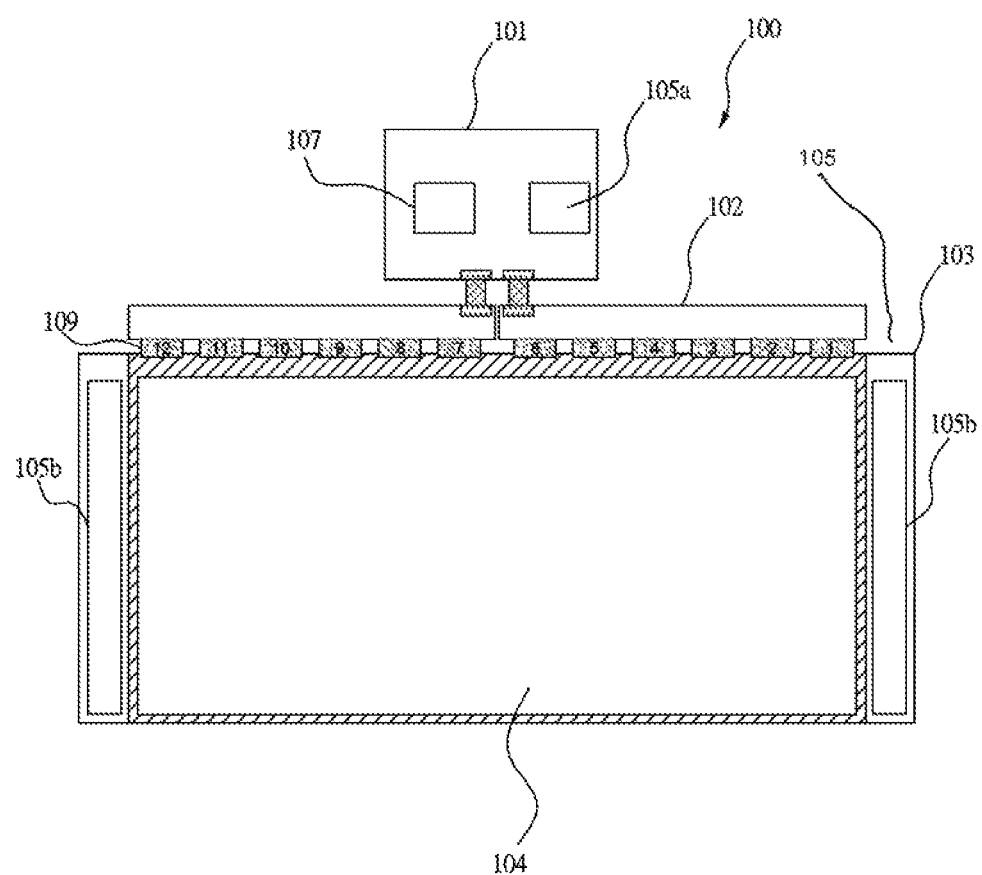
FIG. 7 is a schematic structural view of a display device according to an embodiment of the present application.
Figure 8:
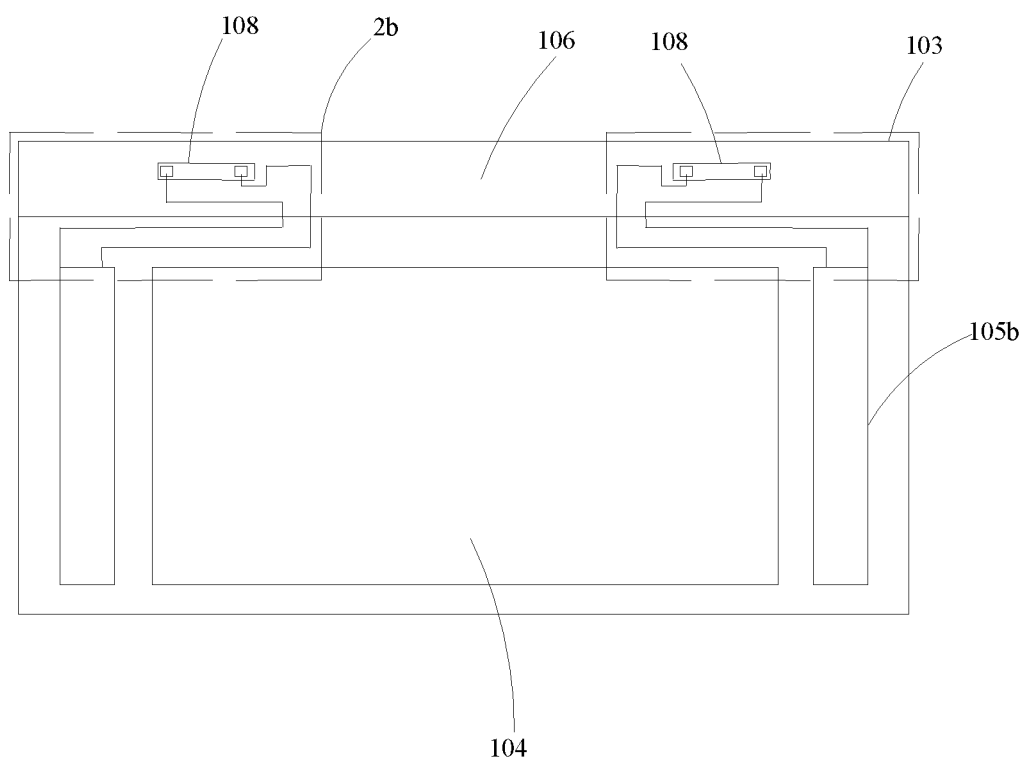
FIG. 8 is a schematic diagram of a wiring structure of a display device according to an embodiment of the present application.

Optionally, please refer to FIG. 7 and FIG. 8, the display device is a gate array drive display device 100. The display device 100 includes a control board 101, a printed circuit board 102, a counter substrate 104, and an active array substrate 103. The gate drive circuit 105 is divided into two parts, one is a boosting portion 105a, and the other is a shift register 105b. The boosting section 105a is disposed on the control board 101, and the shift register 105b is disposed on the active array substrate 104. In some embodiments, the shift register 105b is disposed on both sides of the active array substrate 104, and according to the circuit design, the shift register 105b can be disposed in the wiring area of the array substrate 104. Since the area occupied by the shift register 105b is small, the gate array drive panel can generally achieve an ultra-narrow frame.

In an embodiment, the system board provides color (e.g., R/G/B) compression signals, control signals, and power transmitting to the control board 101. The timing controller (TCON) 107 on the control board 101 processes the signals and the power processed by the drive circuit are transmitted to the source circuit and gate circuit of the printed circuit board 102 through a flexible flat cable (FFC), and the necessary data and power are transmitted to the display area by the source flip chip 109 and the gate array drive circuit disposed on the wiring area of the active array substrate 104, thereby the display obtains the power and signal for presenting the screen demand.

The aforementioned embodiments are only optional embodiments of the present application, and should not be regarded as being limitation to the present application. Any modification, equivalent replacement, improvement, and so on, which are made within the spirit and the principle of the present application, should be included in the protection scope of the present application.

What is claimed is:

1. A display panel, comprising:
an array substrate;
a counter substrate, disposed opposite to the array substrate;
a plurality of active switches, disposed on the array substrate;
a shift register, disposed on the array substrate and located at a side of the array substrate;
a plurality of first testing pads, disposed on the array substrate, wherein the plurality of first testing pads are electrically coupled to the shift register;
a plurality of second testing pads, disposed on the array substrate; and
a tester, disposed on the array substrate, wherein the tester comprises an input and an output, the input of the tester is connected to the plurality of first testing pads to achieve electrically coupling with the shift register, and the output of the tester is connected to the plurality of second testing pads;
wherein the plurality of first testing pads, the plurality of second testing pads, and the tester are disposed between the array substrate and the counter substrate;
wherein the array substrate is a multilayer substrate, the multilayer substrate comprises a first layer plate and a second layer plate; wherein a wiring between the tester and the plurality of first testing pads is disposed on a surface of the first layer plate, a wiring between the tester and the plurality of second testing pads is disposed on a surface of the second layer plate, and the wiring between the tester and the plurality of second testing pads is disposed between the first layer plate and the second layer plate.

2. The display panel of claim 1, wherein the tester is disposed within a range of a region that the counter substrate is vertically projected on the array substrate.

3. The display panel of claim 1, wherein the tester is disposed outside a range of a region that the counter substrate is vertically projected on the array substrate.

4. The display panel of claim 1, wherein the plurality of first testing pads and the plurality of second testing pads are respectively disposed at a side of the array substrate.

5. The display panel of claim 1, wherein the array substrate is a multilayer substrate, the multilayer substrate comprises a first layer plate and a second layer plate; wherein a wiring between the tester and the plurality of first testing pads is disposed on a surface of the second layer plate, and the wiring between the tester and the plurality of first testing pads is disposed between the first layer plate and the second layer plate, and a wiring between the tester and the plurality of second testing pads is disposed on a surface of the first layer plate.

6. The display panel of claim 1, wherein the array substrate is a multilayer substrate, the multilayer substrate comprises a first layer plate and a second layer plate; wherein a wiring between the tester and the plurality of first testing pads and a wiring between the tester and the plurality of second testing pads are disposed on a surface of the first layer plate.

7. The display panel of claim 1, wherein the array substrate is a multilayer substrate, the multilayer substrate comprises a first layer plate and a second layer plate; wherein a wiring between the tester and the plurality of first testing pads and a wiring between the tester and the plurality of second testing pads are disposed on a surface of the second layer plate, and the wiring between the tester and the plurality of second testing pads is disposed between the first layer plate and the second layer plate.

8. The display panel of claim 1, wherein a wiring between the tester and the plurality of first testing pads is adjacent to an edge of the array substrate, and a wiring between the tester and the plurality of second testing pads is adjacent to an edge of the counter substrate.

9. The display panel of claim 1, wherein a wiring between the tester and the plurality of second testing pads is adjacent to an edge of the array substrate, and a wiring between the tester and the plurality of first testing pads is adjacent to an edge of the counter substrate.

10. The display panel of claim 1, wherein a wiring between the tester and the plurality of first testing pads is adjacent to an edge of the array substrate, and a wiring between the tester and the plurality of second testing pads is adjacent to an edge of the array substrate.

11. The display panel of claim 1, wherein a wiring between the tester and the plurality of first testing pads and a wiring between the tester and the plurality of second testing pads are adjacent to an edge of the counter substrate.

12. The display panel of claim 1, wherein a wiring method between the tester and the plurality of first testing pads is a single layer metal wiring method or a double layer metal wiring method.

13. The display panel of claim 1, wherein a wiring method between the tester and the plurality of second testing pads is a single layer metal wiring method or a double layer metal wiring method.

14. The display panel of claim 1, wherein the input of the tester is connected to total or partial of the plurality of first testing pads.

15. The display panel of claim 1, wherein the output of the tester is connected to total or partial of the plurality of second testing pads.

16. A display panel, comprising:
an array substrate;
a counter substrate, disposed opposite to the array substrate;
a plurality of active switches, disposed on the array substrate;
a shift register, disposed on the array substrate and located at a side of the array substrate;
a plurality of first testing pads, disposed on the array substrate, wherein the plurality of first testing pads are electrically coupled to the shift register;
a plurality of second testing pads, disposed on the array substrate; and
a tester, disposed on the array substrate, wherein the tester comprises an input and an output, the input of the tester is one-to-one correspondingly connected to the plurality of first testing pads to achieve electrically coupling with the shift register, the output of the tester is one-to-one correspondingly connected to the plurality of second testing pads;
wherein a wiring between the tester and the plurality of first testing pads is coated onto or bonded to the array substrate, and a wiring between the tester and the plurality of second testing pads is coated onto or bonded to the array substrate;
wherein the array substrate is a multilayer substrate, the multilayer substrate comprises a first layer plate and a second layer plate; wherein a wiring between the tester and the plurality of first testing pads is printed or coated onto a surface of the first layer plate, and a wiring between the tester and the plurality of second testing pads is printed or coated onto a surface of the second layer plate, and the wiring between the tester and the plurality of second testing pads is disposed between the first layer plate and the second layer plate.

17. A display device, comprising a display panel and a controller configured to control the operation of the display panel, wherein the display panel comprises:
an array substrate;
a counter substrate, disposed opposite to the array substrate;
a plurality of active switches, disposed on the array substrate;
a shift register, disposed on the array substrate and located at a side of the array substrate;
a plurality of first testing pads, disposed on the array substrate, wherein the plurality of first testing pads are electrically coupled to the shift register;
a plurality of second testing pads, disposed on the array substrate; and
a tester, disposed on the array substrate, wherein the tester comprises an input and an output, the input of the tester is connected to the plurality of first testing pads to achieve electrically coupling with the shift register, the output of the tester is connected to the plurality of second testing pads;
wherein a wiring method between the tester and the plurality of first testing pads is a single layer metal wiring method, and a wiring method between the tester and the plurality of second testing pads is a double layer metal wiring method;
wherein the array substrate is a multilayer substrate, the multilayer substrate comprises a first layer plate and a second layer plate; wherein a wiring between the tester and the plurality of first testing pads is printed or coated onto a surface of the first layer plate, and a wiring between the tester and the plurality of second testing pads is printed or coated onto a surface of the second layer plate, and the wiring between the tester and the plurality of second testing pads is disposed between the first layer plate and the second layer plate.

* * * * *